United States Patent [19]
Roohparvar

[11] Patent Number: 5,790,459
[45] Date of Patent: Aug. 4, 1998

[54] MEMORY CIRCUIT FOR PERFORMING THRESHOLD VOLTAGE TESTS ON CELLS OF A MEMORY ARRAY

[75] Inventor: Frankie F. Roohparvar, Cupertino, Calif.

[73] Assignee: Micron Quantum Devices, Inc., Santa Clara, Calif.

[21] Appl. No.: 781,427

[22] Filed: Jan. 10, 1997

Related U.S. Application Data

[63] Continuation of Ser. No. 511,614, Aug. 4, 1995, abandoned.
[51] Int. Cl.$^6$ .................................................. G11C 16/06
[52] U.S. Cl. .................... 365/185.21; 365/185.18; 365/185.22; 365/185.23; 365/201
[58] Field of Search ........................ 365/185.21, 201, 365/185.18, 185.23, 185.22

[56] References Cited

U.S. PATENT DOCUMENTS

| 5,499,212 | 3/1996 | Amani | 365/185.23 |
| 5,539,689 | 7/1996 | Aoki | 365/201 |
| 5,539,699 | 7/1996 | Sato et al. | 365/201 |

Primary Examiner—Joseph E. Clawson, Jr.
Attorney, Agent, or Firm—Limbach & Limbach LLP

[57] ABSTRACT

An integrated memory circuit having an array of memory cells and which is operable in at least one test mode as well as in a normal operating mode, and a true $V_{th}$ measurement test implemented by such circuit. The memory circuit includes circuitry for implementing a true $V_{th}$ measurement test mode in which an external voltage (or a sequence of external voltages) is applied to an external pad, and a test voltage at least substantially equal to such external voltage (or a sequence of test voltages, each at least substantially equal to one of a sequence of external voltages) is applied directly to the control gates of all or selected ones of rows of the cells (e.g., to all or selected ones of the wordlines of the array). In preferred embodiments, each memory cell is a nonvolatile memory cell such as a flash memory cell. In preferred embodiments, the memory circuit includes circuitry for allowing application (directly, to the control gates) of test voltages having a broad range of selected values, including values much greater than and values much less than the memory circuit's internal supply voltage. In accordance with the invention, a memory circuit can operate in true $V_{th}$ measurement test modes in which a test voltage substantially equal to the external voltage is applied to the control gates of selected ones of the cells, and the cells are read using the same circuitry (e.g., a sense amplifier) that would be used to execute a normal read operation. The external voltage can be specially selected to have a value (or sequence of values) appropriate for performing any of a variety of tests on the cells.

26 Claims, 5 Drawing Sheets

MEMORY CIRCUIT FOR PERFORMING THRESHOLD VOLTAGE TESTS ON CELLS OF A MEMORY ARRAY

This is a continuation of U.S. application Ser. No. 08/511,614 filed on Aug. 4, 1995, now abandoned.

BACKGROUND OF THE INVENTION

1. Field of the Invention

The invention pertains to integrated memory circuits that are operable either in a first mode in which external pads are connected through buffer circuitry to an array of memory cells such as nonvolatile memory cells (so that data can be written to the cells through an input buffer, or data can be read from the cells through an output buffer), or in a test mode in which the external pads are connected directly to the memory cell array. The integrated circuit of the invention includes circuitry which operates in the test mode to apply desired voltages from an external pad directly to control gates of all or selected ones of the rows of memory cells.

2. Description of Related Art

Throughout the specification, including in the claims, the term "connected" is used (in the context of an electronic component being "connected" to another electronic component) in a broad sense to denote that the components are electrically or electromagnetically coupled with sufficient strength under the circumstances. It is not used in a narrow sense requiring that an electrically conducting element is physically connected between the two components.

Nonvolatile memory chips (integrated circuits) with higher density are being introduced to the market each day. In order to achieve higher density, chip manufacturers must continually decrease the size of elements of the chips (such as the size of each cell of a memory array implemented in each chip). With memory array cells having submicron feature sizes, the slightest change in processing of one memory cell relative to another during manufacture results in a big difference in the behavior of the cells with respect to each other.

Many conventional memory chips operate in either a test mode in which input/output ("I/O") pads are connected directly to an array of memory cells, or in a "normal" (or "active") mode in which the I/O pads are connected through buffer circuitry to the array of memory cells. In the latter mode (the "normal" mode) the chip can perform read/write operations in which data is written to selected ones of the cells through an input buffer (or data is read from selected ones of the cells through an output buffer).

Figure 1:
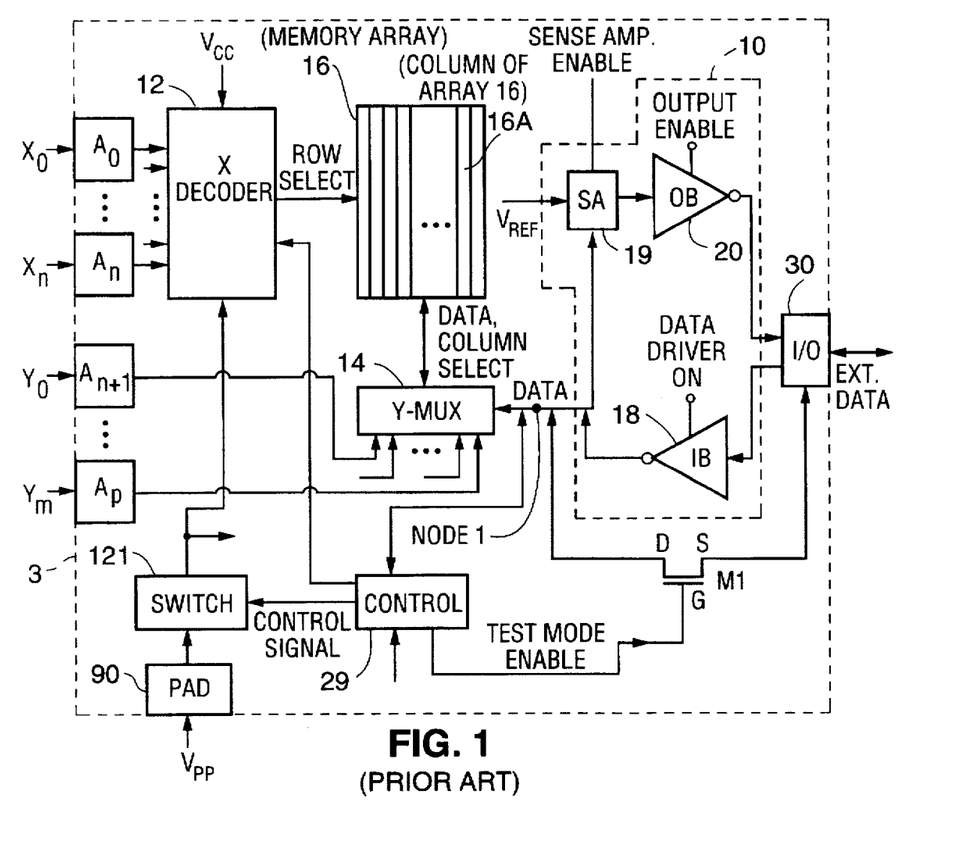
FIG. 1 is block diagram of a conventional nonvolatile memory circuit (implemented as an integrated circuit), including a conventional I/O buffer circuit 10 and a conventional test mode switch M1.

FIG. 1 is a simplified block diagram of a conventional memory chip of this type. Memory chip 3 of FIG. 1 includes at least one I/O pad 30 (for asserting output data to an external device or receiving input data from an external device), input/output buffer circuit 10 for I/O pad 30, test mode switch M1, address buffers A0 through Ap for receiving memory address bits from an external device, row decoder circuit (X address decoder) 12, column multiplexer circuit (Y multiplexer) 14, memory array 16 (comprising columns of nonvolatile memory cells, such as column 16A), pad 90, switch 121 connected between pad 90 and other components of chip 3, and control unit 29. Each of address buffers A0 through Ap includes an address bit pad for receiving (from an external device) a different one of address bit signals X0 through Xn and Y0 through Ym.

I/O buffer circuit 10 includes a "write" branch and a "read" branch. The write branch comprises input buffer 18. The read branch comprises sense amplifier 19 and output buffer 20.

In the normal operating mode of chip 3 of FIG. 1, control unit 29 can cause chip 3 to execute a write operation in which it receives data (to be written to memory array 16) from an external device at I/O pad 30, buffers the data in the write branch, and then writes the data to the appropriate memory cell. Also in this normal operating mode, control unit 29 can cause chip 3 to execute a read operation in which it amplifies and buffers data (that has been read from array 16) in the read branch, and then asserts this data to I/O pad 30.

Although only one I/O pad (pad 30) is shown in FIG. 1, typical implementations of the FIG. 1 circuit include a plurality of I/O pads, and each I/O pad is buffered by an I/O buffer circuit similar or identical to circuit 10. For example, one implementation of the FIG. 1 circuit includes eight I/O pads, eight buffer circuits identical to circuit 10, one line connected between the output of the output buffer 20 of each buffer circuit and one of the I/O pads (so that eight data bits can be read in parallel from buffers 20 to the pads), and one line connected between the input of the input buffer 18 of each buffer circuit and one of the I/O pads (so that eight data bits can be written in parallel from the pads to buffers 18). Each I/O pad (including I/O pad 30) typically has high impedance when the output buffer is not enabled.

Figure 2:
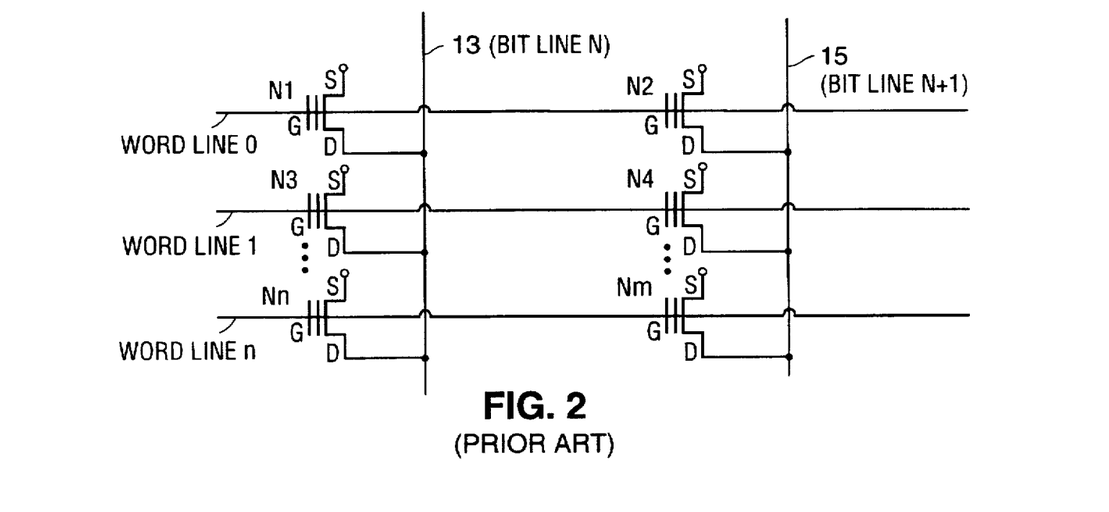
FIG. 2 is a simplified schematic diagram of two columns of memory cells of memory array 16 of FIG. 1.

Each of the cells (storage locations) of memory array circuit 16 is indexed by a row index (an "X" index determined by decoder circuit 12) and a column index (a "Y" index output determined by circuit 14). FIG. 2 is a simplified schematic diagram of two columns of cells of memory array 16 (with one column, e.g., the column on the right, corresponding to column 16A of FIG. 1). The column on the left side of FIG. 2 comprises "n" memory cells, each cell implemented by one of floating-gate N-channel transistors N1, N3, . . . , Nn. The drain of each of transistors N1–Nn is connected to bitline 13, and the gate of each is connected to a different wordline (a different one of wordline 0 through wordline n). The column on the right side of FIG. 2 also comprises "n" memory cells, each cell implemented by one of floating-gate N-channel transistors N2, N4, . . . , Nm. The drain of each of transistors N2-Nm is connected to bitline 15, and the gate of each is connected to a different wordline (a different one of wordline 0 through wordline n). The source of each of transistors N1, N3, . . . , Nn, and N2, N4, . . . , Nm is held at a source potential (which is usually ground potential for the chip during a read or programming operation).

Each memory cell is a nonvolatile memory cell since each of transistors N1, N3, . . . , Nn, and N2, N4, . . . , Nm has a floating gate capable of semipermanent charge storage. The current drawn by each cell (i.e., by each of transistors N1, N3, . . Nn, and N2, N4, . . . , Nm) depends on the amount of charge stored on the cell's floating gate. Thus, the charge stored on each floating gate determines a data value that is stored "semipermanently" in the corresponding cell. In cases in which each of transistors N1, N3, . . . , Nn, N2, N4, . . . , and Nm is a flash memory device (as indicated in FIG. 2 by the symbol employed to denote each of transistors N1, N3, . . . , Nn, N2, N4, . . . , and Nm), the charge stored on the floating gate of each is erasable (and thus the data value stored by each cell is erasable) by appropriately changing the voltage applied to the gate and source (in a well known manner).

In response to address bits Y0–Ym, circuit 14 (of FIG. 1) determines a column address which selects one of the columns of memory cells of array 16 (connecting the bitline of the selected column to Node 1 of FIG. 1), and in response to address bits X0–Xn, decoder circuit 12 (of FIG. 1)

determines a row address which selects one cell in the selected column. Consider an example in which the column address selects the column on the right side of FIG. 2 (the column including bitline 15) and the row address selects the cell connected along wordline 0 (the cell comprising transistor N2). To read the data value stored in the selected cell, a signal (a current signal) indicative of such value is provided from the cell's drain (the drain of transistor N2, in the example), through bitline 15 and circuit 14, to node 1 of FIG. 1. To write a data value to the selected cell, a signal indicative of such value is provided to the cell's gate and drain (the gate and drain of transistor N2, in the example).

With reference again to FIG. 1, the function of switch M1 is to switch the FIG. 1 chip between its test mode and its normal operating mode. Conventionally, switch M1 is an NMOS transistor whose gate receives a control signal ("Test Mode Enable") from internal control logic within control unit 29. The source and drain of M1 are connected in series with I/O pad 30 and circuit 14. Switch M1 operates as follows in response to the control signal:

M1 "on" when Test Mode Enable is high (when the value of Test Mode Enable triggers the "test" mode of FIG. 1), and thus M1 functions as a pass transistor which passes a signal (a "test" signal) indicative of test data to be written to or read from a selected cell of array 16 (e.g., a current signal indicative of test data read from the selected cell) between its source and drain (and thus between I/O pad 30 and the selected cell of array 16). If buffers 18 and 20 of circuit 10 are disabled when M1 is on, the test signals pass through M1 but not through circuit 10; and M1 is "off" when Test Mode Enable is low (when the value of Test Mode Enable triggers the "normal" operating mode of FIG. 1), so that signals (indicative of data to be written to memory array 16) provided from an external device to I/O pad 30 are buffered in input buffer 18 and then asserted to memory array 16, or signals (indicative of data read from memory array 16) are asserted from memory array 16 to sense amplifier 19, amplified in amplifier circuit 19, and then buffered in output buffer 20 and asserted to I/O pad 30. Typically, the "low" value of Test Mode Enable is ground potential.

In the normal operating mode of FIG. 1 (with M1 "off"), the FIG. 1 circuit executes a write operation as follows. Each of address buffers A0 through An asserts one of bits X0–Xn to decoder circuit 12, and each of address buffers An+1 through Ap asserts one of bits Y0–Ym to circuit 14. In response to these address bits, circuit 14 determines a column address (which selects one of the columns of memory cells of array 16, such as column 16A), and circuit 12 determines a row address (which selects one cell in the selected column). In response to a write command supplied from control unit 29, a signal (indicative of data) present at the output of input buffer 18 (which has been enabled by the appropriate level of the control signal "DATA DRIVER ON") is asserted through circuit 14 to the cell of array 16 determined by the row and column address (e.g., to the drain of such cell). During such write operation, output buffer 20 is disabled (in response to an appropriate level of control signal OUTPUT ENABLE).

A data latch (not shown) is typically provided between input buffer 18 and I/O pad 30 for storing data (to be written to a memory cell) received from I/O pad 30. When the latched data is sent to input buffer 18, input buffer 18 produces a voltage at Node 1 which is applied to the selected memory cell. Input buffer 18 is typically implemented as a tri-statable driver having an output which can be placed in a high impedance mode (and thus disabled) during a read operation. Input buffer 18 is disabled by asserting (to input buffer 18) an appropriate level of the control signal DATA DRIVER ON. In some implementations, the functions of the latch and input buffer 18 are combined into a single device.

In the normal operating mode (with M1 "off"), the FIG. 1 circuit executes a read operation as follows. Each of address buffers A0 through An asserts one of bits X0–Xn to address decoder circuit 12, and each of address buffers An+1 through Ap asserts one of bits Y0–Ym to circuit 14. In response to these address bits, circuit 14 asserts a column address to memory array 16 (which selects one of the columns of memory cells, such as column 16A), and circuit 12 asserts a row address to memory array 16 (which selects one cell in the selected column). In response to a read command supplied from control unit 29, a current signal indicative of a data value stored in the cell of array 16 (a "data signal") determined by the row and column address is supplied from the drain of the selected cell through the bitline of the selected cell and then through circuit 14 to sense amplifier 19. This data signal is amplified in amplifier 19, buffered in output buffer 20 (which is enabled by an appropriate level of control signal "OUTPUT ENABLE"), and finally asserted at I/O pad 30. During such read operation, input buffer 18 is disabled (in response to an appropriate level of control signal DATA DRIVER ON).

Chip 3 of FIG. 1 also includes a pad 90 which receives a high voltage $V_{pp}$ from an external device, and a switch 121 connected to pad 90. During some steps of a typical erase or program sequence (in which the cells of array 16 are erased or programmed), control unit 29 sends a control signal to switch 121 to cause switch 121 to close and thereby assert the high voltage $V_{pp}$ to various components of the chip including X decoder 12. Voltage $V_{pp}$ is higher (typically $V_{pp}$=12 volts) than the normal operating mode supply voltage (typically $V_{cc}$=5 volts or $V_{cc}$=5.5 volts) for the MOS transistors of chip 3.

When reading a selected cell of array 16, if the cell is in an erased state, the cell will conduct a first current which is converted to a first voltage in sense amplifier 19. If the cell is in a programmed state, it will conduct a second current which is converted to a second voltage in sense amplifier 19. Sense amplifier 19 determines the state of the cell (i.e., whether it is programmed or erased corresponding to a binary value of 0 or 1, respectively) by comparing the voltage indicative of the cell state to a reference voltage. The outcome of this comparison is an output which is either high or low (corresponding to a digital value of one or zero) which sense amplifier 19 sends to output buffer 20, which in turn asserts a corresponding data signal to I/O pad 30 (from which it can be accessed by an external device).

During the test mode, input buffer 18, sense amplifier 19, and output buffer 20 are all disabled (in response to appropriate levels of their respective control signals DATA DRIVER ON, SENSE AMPLIFIER ENABLE, and OUTPUT ENABLE, which are generated by control unit 29).

During a write operation in the normal operating mode, control signal SENSE AMPLIFIER ENABLE disables sense amplifier 19. During a read operation in the normal operating mode, circuit 14 is employed to access the desired cell in array 16 and control signal SENSE AMPLIFIER ENABLE enables sense amplifier 19 so that sense amplifier 19 can determine the state of the selected cell as described.

It is important during a write operation (in the normal operating mode) to provide the wordline of the selected cell with the proper voltage and the drain of the selected cell with the appropriate voltage level (the voltage determined by the output of input buffer 18), in order to successfully write data to the cell without damaging the cell.

Figure 3:
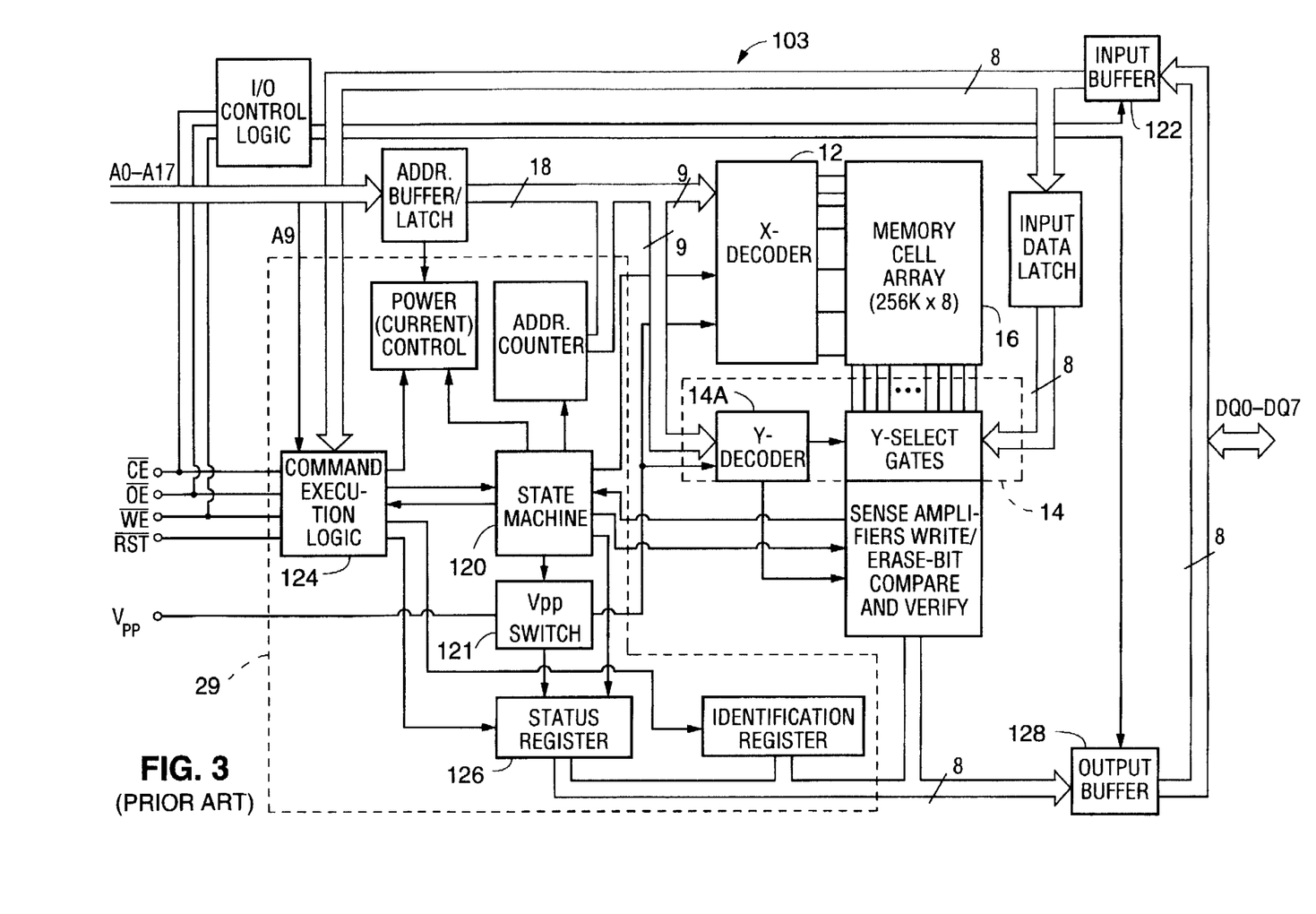
FIG. 3 is block diagram of a conventional nonvolatile (flash) memory circuit (implemented as an integrated circuit).

FIG. 3 is a block diagram of a conventional flash memory chip 103 which is a variation on memory chip 3 of FIG. 1 and which performs essentially all the same functions as does chip 3. The components of flash memory system 103 which correspond to components of memory chip 3 of FIG. 1 are identified by the same reference numerals as in FIG. 1. Memory array 16 of system 103 consists of flash memory cells arranged in rows and columns with there being a total of 256K of eight bit words in the array. The individual cells (not depicted) are addressed by eighteen address bits (A0–A17), with nine bits being used by X decoder circuit 12 to select the row of array 16 in which the target cell is located and the remaining nine bits being used by Y decoder circuit 14A (of Y-multiplexer 14) to select the appropriate column of array 16.

Internal state machine 120 of control unit 29 of memory chip 103 controls detailed operations of chip 103 such as the various individual steps necessary for carrying out programming, reading and erasing operations. State machine 120 thus functions to reduce the overhead required of the processor (not depicted) typically used in association with chip 103.

If memory array 16 is to be erased (typically, all or large blocks of cells are erased at the same time), the processor must cause the Output Enable $\overline{OE}$ pin to be inactive (high), and the Chip Enable $\overline{CE}$ and Write Enable $\overline{WE}$ pins to be active (low). The processor can then issue an 8 bit command 20H (0010 0000) on data I/O pins DQ0–DQ7, typically called an Erase Setup command (one of I/O pins DQ0–DQ7 corresponds to I/O pad 30 of FIG. 1). This is followed by issuance of a second eight bit command D0H (1101 0000), typically called an Erase Confirm command. Two separate commands are used so as to minimize the possibility of an inadvertent erase operation.

The commands are transferred to data input buffer 122 (input buffer 18 of FIG. 1 corresponds to a component of buffer 122 which receives one bit of each command) and the commands are then transferred to command execution logic unit 124 of control unit 29. Logic unit 124 then instructs state machine 120 to perform all of the numerous and well known steps for erasing array 16.

During some steps of a typical erase sequence, state machine 120 sends a control signal to switch 121, to cause switch 121 to close and thereby assert a high voltage $V_{pp}$ to various components of chip 103, including X decoder 12 and Y multiplexer 14. As in chip 3 of FIG. 1, voltage $V_{pp}$ is typically received by chip 103 from an external device at a power supply pad of chip 103 connected to switch 121 (e.g., pad 90 shown in FIG. 1). Voltage $V_{pp}$ is higher (typically $V_{pp}$=12 volts) than the normal operating mode supply voltage Atypically $V_{cc}$=5 volts or $V_{cc}$=5.5 volts) for the MOS transistors of chip 103.

Once the erase sequence is completed, state machine 120 updates an 8 bit status register 126, the contents of which are transferred to data output buffer 128 which is connected to data I/O pins DQ0–DQ7 of the memory system (output buffer 18 of FIG. 1 corresponds to a component of buffer 128 which receives one bit from register 126). The processor will periodically poll the data I/O pins to read the contents of status register 126 in order to determine whether the erase sequence has been completed and whether it has been completed successfully.

Chip 103 of FIG. 3 (and chip 3 of FIG. 1) typically implements a complicated sequence of steps to erase all or selected ones of the cells of array 16 (so that they store data indicative of a logical "1") or Lo program all or selected ones of such cells (so that they store data indicative of a logical "0"). These steps typically include verification steps for verifying the status of all or selected ones of the cells at various stages of an erase (or programming) operation.

During a typical erase operation, it is desired to erase all the cells of array 16 so that the threshold voltages are all within a specified voltage range. That range is typically a small positive voltage range such as from +1.5 to +3.0 volts. If the erased cells fall within this range, the cell to be read (the "selected" or "target") cell will produce a cell current in a read operation. The presence of cell current flow indicates that the cell is in an erased state (logic "1") rather than a programmed state (logic "0"). Cell current is produced in a selected erased cell if the voltage applied to the control gate of the cell, by way of the wordline connected to X decoder 12, exceeds the threshold voltage of the erased cell. In addition, cells which are not being read ("deselected" cells) are prevented from producing a cell current even if such cells have been erased to a low threshold voltage state. By way of example, for cells located in the same row as the selected cell, by definition, share the same wordline as the selected cell. However, the drains of the deselected cells will be floating thereby preventing a cell current from being generated. Deselected cells in the same column will not conduct cell current because the wordlines of such deselected cells are typically grounded. Thus, the gate-source voltage of these cells will be insufficient to turn on these deselected cells even if they are in an erased state.

After an erase operation, the vast majority of cells will have a proper erased threshold voltage. However, it is possible that a few (or even one) of the cells may have responded differently to the erase sequence and such cell(s) have become overerased. If a cell is overerased, the net charge on its floating gate will be positive. The result will be that the threshold voltage will be negative to some extent. Thus, when such overerased cell is deselected (the wordline connected to the overerased deselected cell is grounded), the deselected cell will nevertheless conduct current. This current will interfere with the reading of the selected cell thereby preventing proper memory operation.

It is necessary to perform a complicated sequence of steps to erase or program the cells of a conventional nonvolatile memory chip because the individual cells of each array of such a chip typically behave differently, and thus the chip's state machine needs to ensure that all cells have at least a minimum margin at the end of each erase (or program) operation. This, however, does not mean that all the cells will be left with the same threshold voltage ($V_{th}$) at the end of an erase or program operation. For example, if during programming of all cells of an array, the state machine sets the minimum $V_{th}$ of all programmed cells to 5.5 volts, there may be many cells that have been programmed to a $V_{th}$ in the range from 7 to 7.5 volts at the end of the programming operation. So, there is a range of $V_{th}$S for the programmed cells. The same is true for an erase operation, and thus there is typically a range of $V_{th}$S for the erased cells. The $V_{th}$ range for erased cells may typically be from 1 volt to 3 volts after an erase operation, if the maximum $V_{th}$ of an erased bit is set to 3 volts by the state machine.

Measuring the $V_{th}$ distribution of the cells of an array (after erase and program operations) is of great importance to memory manufacturers and designers. The degree of tightness of such distribution is a good indicator of how well the memory elements have been processed (e.g., during manufacture of the chip) and how well the state machine is functioning.

The threshold voltages ("$V_{th}$S") of nonvolatile cells of a memory array have conventionally been measured indirectly (during a test mode) by measuring current/voltage ("I/V") characteristics of the cells for a sequence of different voltages between the source and drain of each cell and then deriving the $V_{th}$ values from the measured I/V characteristics. For example, in a conventional test mode implemented by the FIG. 1 chip, a selected cell of array 16 is connected directly to I/O pad 30 (or to several I/O pads including pad 30 and other I/O pads), and a current/voltage characterization is performed on the selected cell as follows. The voltage at the cell's drain (the potential at which bitline 15 of FIG. 2 is held, for example) is controllable since the selected bitline is directly connected to an external device through I/O pad 30, and the external device varies the voltage at which the bitline (bitline 15, in the example) is held. By sweeping the voltage on I/O pad 30 during the test mode and monitoring the resulting cell current (the current flowing from the selected cell's drain through bitline 15, circuit 14, Node 1, and switch M1 to I/O pad 30, in the example), an I/V curve for the cell is obtained. This process is repeated for each of a sequence of gate voltages to obtain a family of I/V curves for the cell, and the family of I/V curves is analyzed to determine the cell's threshold voltage.

However, there are several serious problems with (and limitations of) conventional methods (such as the method described in the previous paragraph) and conventional apparatus for test mode measurement of I/V curves for selected cells. One such problem is that the tester must arbitrarily assign a current value which characterizes a cell as an "erased" or "programmed" cell when analyzing the measured I/V curves. However, this arbitrarily assigned value is not necessarily the reference current value employed in the sense amplifier to determine the state of each cell during normal (non-test mode) chip operation. Thus, even though a cell is arbitrarily identified by the tester as a "programmed" cell (as a result of test mode operation of the chip), the sense amplifier may be able to read the cell as an erased cell (during normal operation of the chip).

Another of such problems is that measurement of cell current (in a conventional test mode) must be done through the measurement unit of the tester. Thus, the operations of switching from cell address to cell address and making the measurement for each cell consumes a very long time per byte. For a four megabyte or larger cell array, the amount of time required for measuring all the cells is very long, and the tester does not usually have the capability to make decisions regarding passage or failure of bits based on continuous I/V measurement.

To overcome these (and other) problems with conventional measurement of the threshold voltage ($V_{th}$) of cells of a memory chip, it would be desirable to make such $V_{th}$ measurements in a more direct manner, such as by: applying a sequence of selected voltages directly to all or selected ones of the wordlines of the cell array (and thus to the gates of all or selected ones of the rows of the cells); in response to application of each selected voltage, employing the chip's read circuitry (including the sense amplifier and other circuitry employed to execute a read operation in the chip's normal operating mode) to read the cells connected along each wordline; and identifying which of the cells are read by the read circuitry as being in their intended (erased or programmed) state and which of them are not read as being in their intended state. By implementing such direct (or "true") $V_{th}$ measurements, the threshold voltage of each cell could be rapidly and directly measured. However, until the present invention, no memory chip had been designed to be capable of operating in a test mode (a "true $V_{th}$ measurement test mode") for implementing such true $V_{th}$ measurements. Conventional test mode circuitry could not implement a true $V_{th}$ measurement test mode, since such conventional circuitry could not apply the full range of voltages to the wordlines that is needed to measure the full range of typical $V_{th}$ values for erased and programmed cells.

One reason why a memory chip including conventional test mode circuitry lacks the latter capability is apparent from the following explanation. In such a conventional chip, wordlines are accessed through PMOS transistors formed in a well in a row address decoder circuit (e.g., X decoder 12 of FIG. 1). The supply voltage for such PMOS transistors (denoted as $V_{cc}$ in FIG. 1) is typically equal to 5 volts or 5.5 volts. If an attempt were made to decrease a "wordline voltage" (a voltage to be applied to a wordline through the decoder) from $V_{cc}$ to a selected value less than ($V_{cc}-V_t$), where $V_t$ is the threshold voltage (typically less than 1 volt) of the decoder's PMOS devices, the well would turn on and clamp the wordline voltage (thus preventing the wordline voltage from being further decreased to the selected value). This would prevent the wordline voltage from being decreased to values that are sufficiently low (e.g., values in the range from 1 volt to 3.5 volts) to measure the $V_{th}$S of typical erased cells The present invention provides a means for implementing a true $V_{th}$ measurement test mode in which a sequence of selected voltages is applied directly to all or selected ones of the wordlines of a memory cell array, which is not subject to the problems and limitations described in the four previous paragraphs.

SUMMARY OF THE INVENTION

The integrated memory circuit of the invention has a memory cell array, and is operable in at least one test mode as well as in a normal operating mode. Another aspect of the invention is a true $V_{th}$ measurement test implemented by such memory circuit. The memory circuit includes means for implementing a true $V_{th}$ measurement test mode in which an external voltage (or a sequence of selected external voltages) is applied to an external pad, and a test voltage at least substantially equal to such external voltage (or a sequence of test voltages at least substantially equal to a sequence of external voltages) is applied directly to the control gates of selected ones of the cells of the array (e.g., to selected ones of the wordlines of the array). In preferred embodiments, each memory cell of the integrated memory circuit is a nonvolatile memory cell such as a flash memory cell.

The inventive memory chip preferably includes circuitry which allows application (directly to the control gates of the cells) of test voltages having a broad range of selected values, including values much greater than the chip's internal supply voltage $V_{cc}$ and values much less than such internal supply voltage. In preferred embodiments, such circuitry is isolation circuitry included in a switch connected between the external pad and the memory array, where the switch has an output which asserts a voltage substantially equal to the test voltage. The isolation circuitry includes means for decoupling the output of the switch from said internal supply voltage (during test modes in accordance with the invention). For example, the isolation circuitry prevents the well of a PMOS transistor in the switch from turning on (in response to a low value of the external voltage), and thereby prevents the PMOS transistor from undesirably clamping the output of the switch at a voltage (substantially equal to the internal supply voltage) and substantially above the low value of the external voltage.

The inventive circuitry allows a memory chip to operate an true $V_{th}$ measurement test modes in which a test voltage substantially equal to an external voltage is applied to the control gates of selected ones of the cells of a memory array, and the cells are read using the same circuitry (e.g., a sense amplifier) that would be used to execute a normal read operation when the chip is not in a test mode. The essential difference between such a normal read operation and a read operation in one of the true $V_{th}$ measurement test modes is that the external voltage can be specially selected to have a value (or sequence of values) appropriate for performing any of a variety of tests on the cells.

In a class of embodiments, a true $V_{th}$ measurement test performed in accordance with the invention includes the steps of performing a fast read cycle while applying a test voltage to the control gates of cells, and logging which of the cells fail to read as expected (thereby generating useful test data concerning the threshold voltage distribution of the cells). For example, where such a test is performed after the cells have undergone an erase operation (so that cells' threshold voltages are in a range from 1 volt to 3 volts) a sequence of test voltages in the range from 1 volt to 3 volts is applied to the control gates, a fast read cycle performed while applying each of the test voltages, and those of the cells that fail to read as an erased cell (i.e., those for which the sense amplifier detects current flow less than the sense amplifier's reference current value) are identified for each test voltage. A true $V_t$ measurement test of this type (and variations thereon) can be performed several times, each time with a different sense amplifier reference current value.

DETAILED DESCRIPTION OF THE INVENTION

A preferred embodiment of the invention will be described with reference to FIGS. 4, 5, and 6. This embodiment is a memory chip (identified by reference numeral 3') which includes (within X decoder 12') a preferred embodiment of the inventive test mode circuitry.

Figure 4:
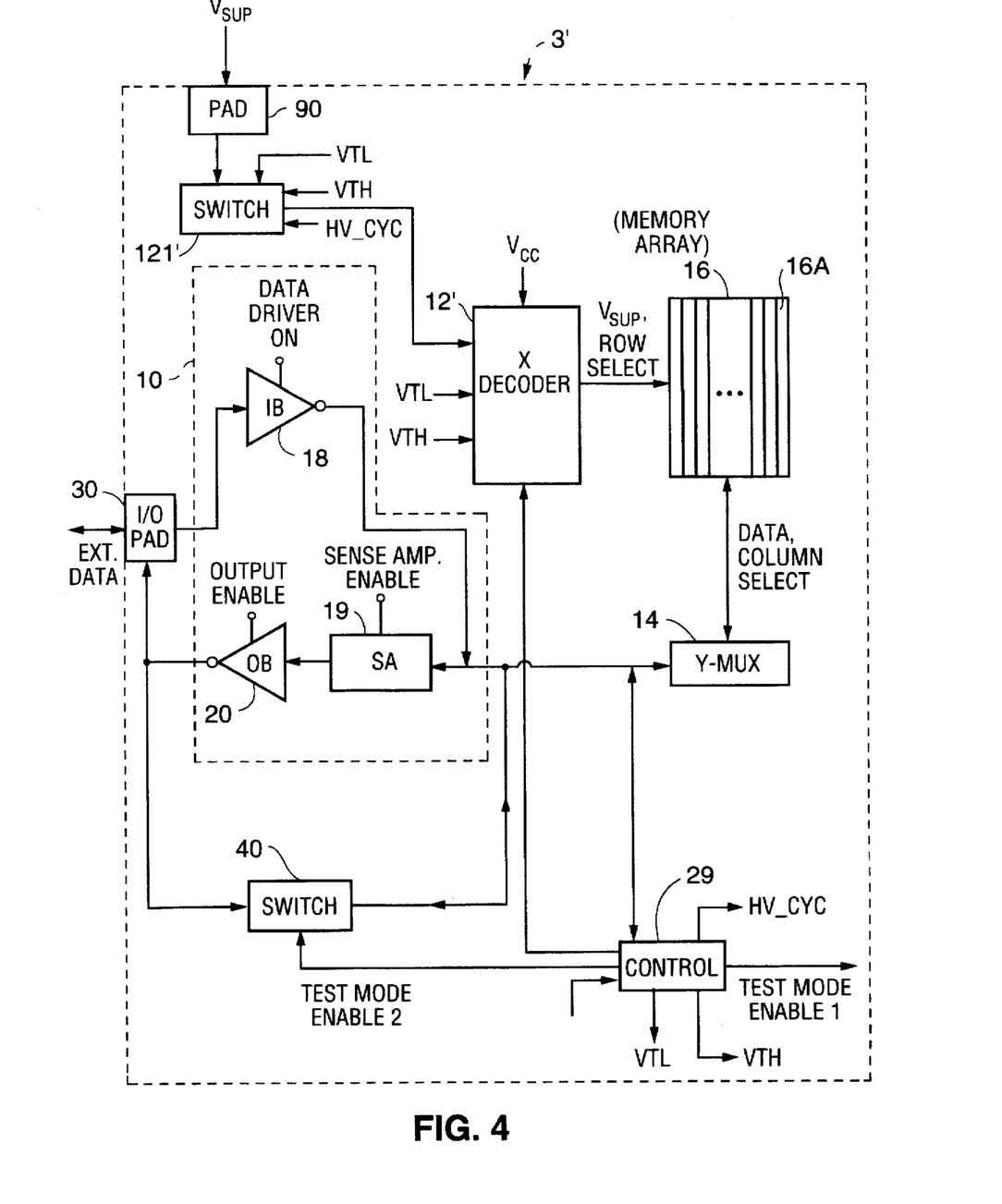
FIG. 4 is a block diagram of a preferred embodiment of the integrated nonvolatile memory circuit of the invention.

Memory chip 3' of FIG. 4 is identical to conventional memory chip 3 of FIG. 1 except in the following respects: chip 3' includes X decoder circuit 12' (which includes circuitry embodying the invention) rather than conventional X decoder 12; chip 3' includes switch 121' (which includes circuitry embodying the invention) rather than switch 121 of FIG. 1; switch 121' is connected to pad 90 for receiving a voltage $V_{sup}$ (supplied from an external device through pad 90) and the state of switch 121' is determined by control signals "VTH," "VTL," and "HV_CYC " from control unit 29; the state of test mode switch 40) is determined by another control signal "Test Mode Enable 2" from control unit 29; and chip 3' is capable of operating in test modes in which X decoder 12' asserts the voltage $V_{sup}$ received from pad 90 to the control gates of cells of all or selected ones of the wordlines of array 16.

When chip 3' implements a true $V_{th}^r$ measurement test mode in accordance with the invention, a sequence of different voltages $V_{sup}$ is applied to all or selected ones of the wordlines of array 16 (through switch 121' and X decoder 12') and the cells connected to such wordlines are read (using sense amplifier 19 and output buffer 20) once for each applied value of $V_{sup}$. Chip 3' can also operate in other test modes in which a selected voltage $V_{sup}$ is applied (through switch 121' and X decoder 12') directly to wordlines of array 16 while another voltage is applied from an external pad (e.g., I/O pad 30) directly to the drain of one or more selected cells of array 16, in order to evaluate the voltage-current characteristics of those cells.

Although test mode switch 40 of chip 3' can be identical to conventional test mode switch M1 of FIG. 1, switch 40 is preferably implemented as one of the preferred test mode switches described with reference to FIGS. 4 and 5 of the U.S. patent application entitled "Memory Circuit with Switch for Selectively Connecting an Input/Output Pad Directly to a Nonvolatile Memory Cell" (Attorney Docket No. MCRN-F1300), filed by F. Roohparvar and M. S. Briner on Jul. 28, 1995, the disclosure of which is hereby incorporated in full into the present disclosure by reference.

It is contemplated that in preferred embodiments of the memory chip of the invention, each memory cell in each memory array of the chip (e.g., array 16) is a nonvolatile memory cell such as a flash memory cell.

Generation of the control signals needed for entry into each of the test modes of the inventive memory chip is preferably accomplished in the manner described in the U.S. patent application entitled "Memory System Having Internal State Monitoring Circuit" (Attorney Docket No. MCRN-F1200), filed on Jul. 28, 1995, and in U.S. patent application Ser. No. 08/386,704 entitled "Apparatus for Entering and Executing Test Mode Operations for Memory," filed Feb. 10, 1995, the disclosures of which are hereby incorporated in full into the present disclosure by reference. In preferred embodiments of the invention, control unit 29 includes the circuitry for generating the control signals needed for entry into each test mode (in response to signals received at external pads of the chip), and the circuitry for generating the control signals needed for controlling operation of the chip during execution of some test mode operations and for controlling operation of the chip in the normal operating mode.

With reference to FIG. 4, when memory chip 3' enters certain ones of its test modes (including the true $V_{th}$ Measurement test mode), the level of at least one of control signals "VTH" and "VTL" asserted from control unit 29 to switch 121' goes high, and the level of control signal "Test Mode Enable 2" asserted from control unit 29 to switch 40 goes low. In response to such high level of at least one of VTH and VTL, switch 121' enters a closed (conductive) state in which it asserts voltage $V_{sup}$ from pad 90 to X decoder 12'. Voltage $V_{sup}$ can have any of a broad range of selected values, including values much greater than the supply voltage $V_{cc}$ of chip 3' and values much less than supply voltage $V_{cc}$. In response to the low level of Test Mode Enable 2, switch 40 enters an "open" (nonconductive) state in which signals (indicative of data to be written to memory array) provided from an external device to I/O pad 30 are buffered in input buffer 18 and then asserted to memory array 16, or signals (indicative of data read from memory array 16) are asserted from memory array 16 to sense amplifier 19, amplified in amplifier circuit 19, and then buffered in output buffer 20 and asserted to I/O pad 30. Typically, the "low" value of Test Mode Enable is ground potential.

In other test modes of chip 3' (not including the inventive true $V_{th}$ measurement test mode), the level of Test Mode Enable 2 is high, and switch 40 responds thereto by entering its "closed" (conductive) state in which it passes test signals indicative of test data to be written to or read from a selected cell or cells of array 16 (e.g., a current signal indicative of test data read from a selected cell). In such modes, buffers 18 and 20 are disabled and the rest signals pass through switch 40 (and thus between I/O pad 30 and the selected cell or cells of array 16) without passing through buffer 10.

As noted, in the true $V_{th}$ measurement test mode of chip 3', control unit 29 asserts at least one of VTH and VTL with a high level to switch 121', to cause switch 121' to provide voltage $V_{sup}$ from pad 90 to X decoder 12'. A preferred embodiment of switch 121' for accomplishing this function is next described with reference to FIG. 5.

Figure 5:
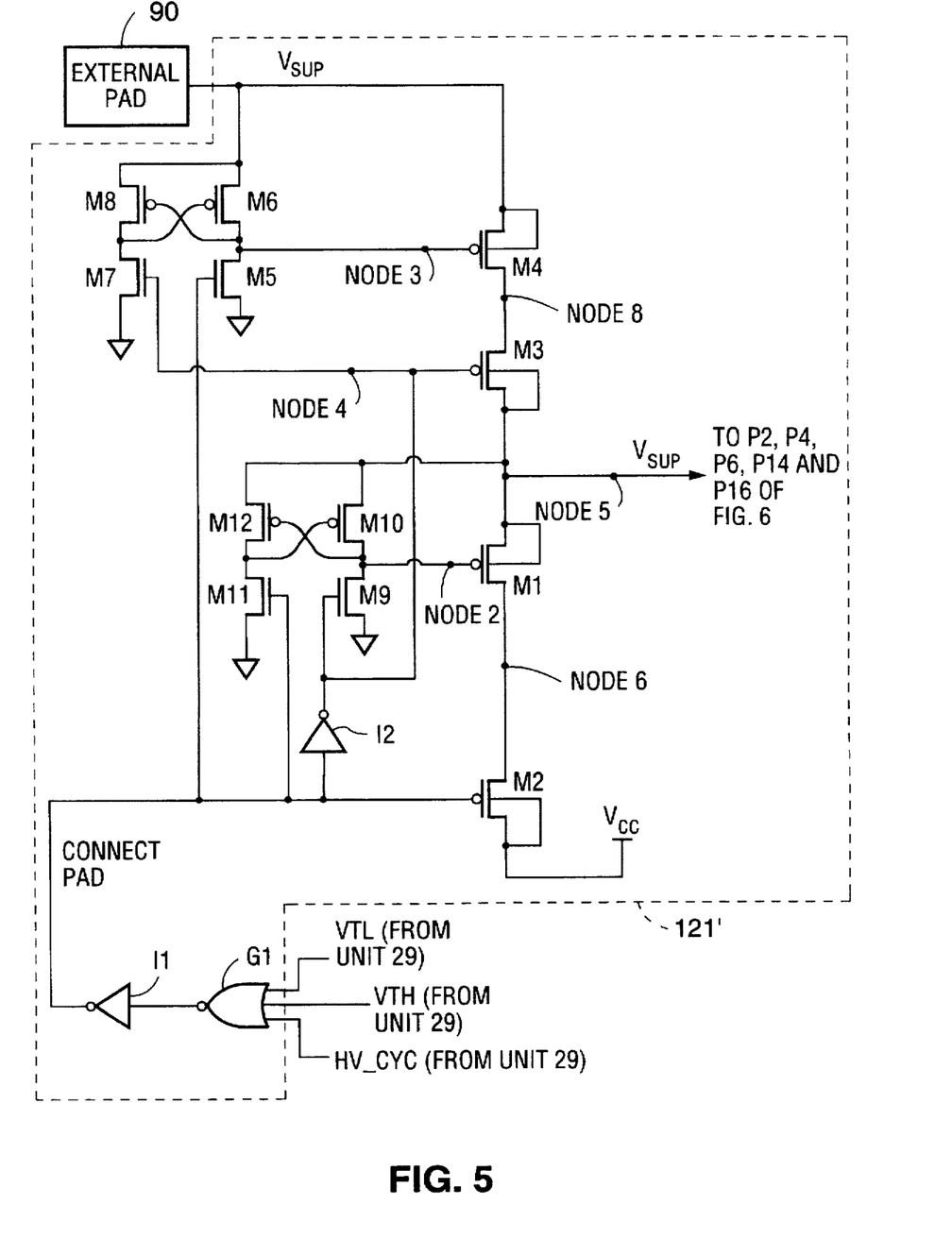
FIG. 5 is a schematic diagram of switch 121' of FIG. 4.

As shown in FIG. 5, control unit 29 asserts control signals VTL, VTH, and HV_CYC to NOR gate G1 of switch 121'. Signal VTH has a high level (a logical "1") during the true $V_{th}$ measurement test mode when $V_{sup}$ is above the supply voltage $V_{cc}$ (e.g., when $V_{cc}$ is 5 volts, and $V_{sup}$ is 12 volts), and a low level (a logical "0") during the true $V_{th}$ measurement test mode when $V_{sup}$ is below supply voltage $V_{cc}$. Also in the true $V_{th}$ measurement test mode, signal VTL has a high level when $V_{sup}$ is below the supply voltage $V_{cc}$ (e.g., when $V_{cc}$ is 5 volts, and $V_{sup}$ is 3 volts), and a low level when $V_{sup}$ is above supply voltage $V_{cc}$.

Typically, control unit 29 asserts signal VTL with a high level (and $V_{sup}$ is less than $V_{cc}$) during a process of determining threshold voltages (or threshold voltage distributions) of erased cells of array 16 in a true $V_{th}$ measurement test mode (since erased cells typically have threshold voltages substantially lower than $V_{cc}$). Typically, control unit 29 asserts signal VTH with a high level (and $V_{sup}$ is greater than $V_{cc}$) at some stages of a process of determining threshold voltages (or threshold voltage distributions) of programmed cells of array 16 in a true $V_{th}$ measurement test mode (since programmed cells typically have threshold voltages approximately equal to $V_{cc}$).

During normal operation (i.e., non-test mode operation), signal HV_CYC (which is also generated in control unit 29) goes high when high voltage operations are required, such as to program or erase cells of the memory array. For this reason, signal HV_CYC is supplied as a third input to NOR gate G1 of FIG. 5.

The output of NOR gate G1 is inverted in inverter I1, so that I1 outputs control signal "CONNECT PAD." Signal "CONNECT PAD" has a low level only when all of VTL, VTH, and HV_CYC are low. When any of VTL, VTH, and HV_CYC are high, signal "CONNECT PAD" is high.

Switch 121' of FIG. 5 also includes NMOS transistors M5, M7, M9, M11, PMOS transistors M1, M2, M3, M4, M6, M8, M10, and M12, and inverter I2 connected as shown. Voltage $V_{cc}$ is applied to the source of transistor M2, the drain of M2 is connected to the drain of M1, the source of M1 is connected to the source of M3, the drain of M3 is connected to the drain of M4, and the source of M4 is connected to pad 90. $V_{sup}$ and $V_{cc}$, are above ground potential (typically $V_{cc}$ is 5 volts above ground)

In operation of switch 121' of FIG. 5, when "CONNECT PAD" is high, M2 is off, M1 is off (since M9 and M12 are off and M11 and M10 are on, and thus Node 2 is high), and M3 and M4 are on (since M7 and M6 are off and M5 and M8 are on, and thus Nodes 3 and 4 are low). Thus, Node 5 (connected to the sources of transistors P2, P4, P6, P14, and P16 of decoder 12' of FIG. 6) is at a voltage substantially equal to $V_{sup}$. For simplicity, Node 5 will be referred to as being "at" $V_{sup}$ under these conditions.

In operation of switch 121' of FIG. 5, when "CONNECT PAD" is low, M2 is on, M1 is on (since M9 and M12 are on and M11 and M10 are off, and thus Node 2 is low), and M3 and M4 are off (since M7 and M6 are on and M5 and M8 are off, and Nodes 3 and 4 are high). Thus, Node 5 (connected to the sources of transistors P2, P4, P6, P14, and P16 of decoder 12' of FIG. 6) is at a voltage substantially equal to $V_{cc}$.

In switch 121' of FIG. 5, the function of M1 is to isolate Node 5 from being coupled or otherwise connected to $V_{cc}$ through the well of M2 (the well in which M2 is formed) at times when CONNECT PAD is high. If transistor M1 of FIG. 5 were replaced by a short circuit, and an attempt were made to decrease the output voltage at Node 5 from a value substantially equal to $V_{cc}$ to a selected value less than ($V_{cc}-V_t$), where $V_t$ is the threshold voltage PMOS transistor M2, the well of transistor M2 would turn on and clamp the output voltage at Node 5 at a value substantially equal to $V_{cc}-V_t$ (thus preventing the output voltage from being further decreased to the selected value). With M1 connected as shown, Node 6 floats when CONNECT PAD is high, and thus the well of M2 will not turn on (regardless of the value of $V_{sup}$).

Similarly, the function of transistor M3 is to isolate Node 5 from being coupled or otherwise connected to pad 90 through the well of M4 (the well in which M4 is formed) at times when CONNECT PAD is low. With M3 connected as shown, Node 8 floats when CONNECT PAD is low, and thus the well of M4 will not turn on (regardless of the value of $V_{cc}$ relative to the voltage at pad 90).

Figure 6:
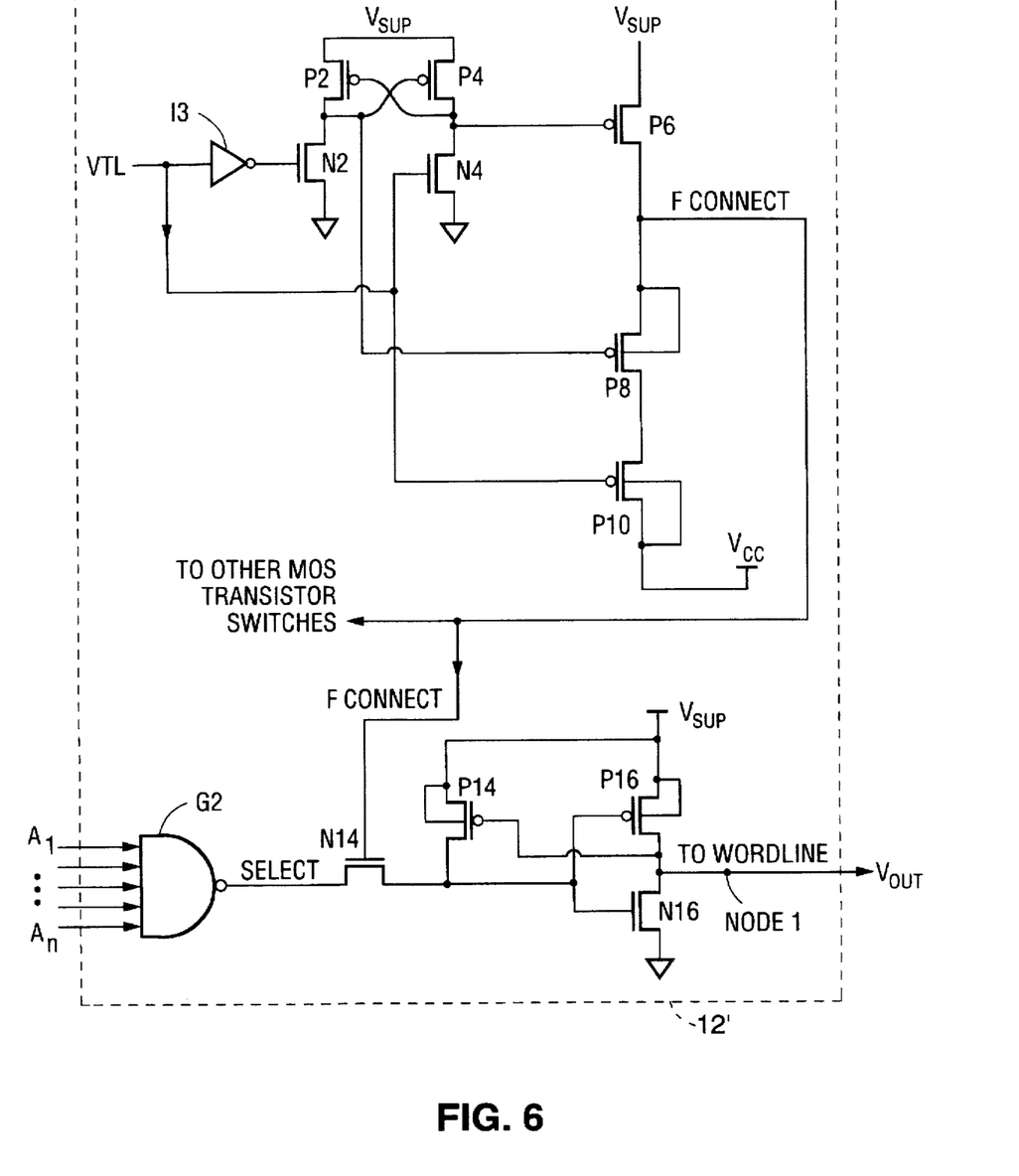
FIG. 6 is a schematic diagram of a portion of the circuitry within X decoder circuit 12' of FIG. 4.

Next, with reference to FIG. 6, we describe preferred circuitry within X decoder 12' for supplying voltage $V_{sup}$ to all or selected ones of the wordlines of array 16 at times when switch 121' asserts she voltage $V_{sup}$ thereto (e.g., when switch 121' asserts voltage $V_{sup}$ at Node 5 of FIG. 5). FIG. 6 shows a portion of the circuitry of a preferred embodiment of X decoder 12'. The remaining components of decoder 12' are not shown since they are conventional (they can be identical to those of conventional decoder 12 of FIG. 1).

For each wordline of array 16, decoder 12' includes a NAND gate (such as NAND gate G2 of FIG. 6); a wordline driver identical to the circuit comprising PMOS transistors P14 and P16 and NMOS transistor N16 connected as shown in FIG. 6; and a MOS transistor switch connected between the NAND gate and the wordline driver (e.g., NMOS transistor N14 having a first channel terminal connected to NAND gate G2 and a second channel terminal connected to the drain of P14 and the gates of P16 and N16). When address bits A1-An have selected a wordline, the output of the corresponding NAND gate is low (otherwise, the NAND gate output is high). For example, to select the wordline connected to Node 1 of FIG. 6, all of address bits A1-An go high and the output of NAND gate G2 of FIG. 6 (the signal "SELECT") goes low.

As will be described later, the voltage signal FCONNECT either has a high value ($V_{cc}$) or a low value ($V_{sup}$). In either case, the value of FCONNECT is higher than one NMOS threshold voltage $V_t$ (e.g. the threshold voltage of N14, which is typically about 0.7 volts) and hence a low value (e.g., 0 volts) output from NAND gate G2 is passed through N14 to the common gate of transistors P16 and N16. Since transistors P16 and N16 comprise an inverter, a low voltage value passed through N14 will turn this inverter on, and thus Node 1 of FIG. 6 and the selected wordline will have a high value substantially equal to $V_{sup}$. During normal (i.e., non-high voltage) operation of the chip, $V_{sup}$ is substantially equal to $V_{cc}$ (as was explained above with reference to switch 121'). During high voltage cycles of the state machine, $V_{sup}$ is connected to the high voltage being asserted to external pad 90.

It will be understood that, typically, one or more inverters are connected to different combinations of the inputs of the NAND gates of different wordlines (so that each unique combination of bits A1-An will select only one of the wordlines). So, at any instant of time during typical operation, all but one of the NAND gates will output a high value (e.g., a value substantially equal to $V_{cc}$) and only one of the NAND gates will output a low value (e.g., 0 volts).

When NAND gate G2 outputs a high value of the signal SELECT (equal to $V_{cc}$) transistor N14 will assert a high voltage (equal to $V_{cc}-V_t$) to the common gate of transistors P16 and N16, and N14 will then turn off (since its $V_{GS}$ is below a threshold voltage) The value $V_{cc}-V_t$ passed through to the gate of P16 and N16 is large enough to turn on N16, thus pulling Node 1 of FIG. 6 (and the voltage $V_{out}$ on the wordline connected to Node 1) down to a low voltage in order to deselect the wordline. P14 then turns on to pull the common gate of N16 and P16 to the $V_{sup}$ revel and thus fully turn off transistor P16 (provided $V_{sup}$ is sufficiently high). This half latch structure, which acts as a level shifter which shifts the level ($V_{cc}$) output from NAND gate G2 to the $V_{sup}$ level, works well when $V_{sup}$ is greater than $V_{cc}-V_t$, for example when $V_{sup}$ goes as high as 7.8 volts or 12 volts for reading (with signal VTH at a "high" level and VTL at a "low" level).

However, the remaining circuitry shown in FIG. 6 is provided to avoid a problem which could otherwise occur (without such circuitry) when $V_{sup}$ is below $V_{cc}$. This problem would occur if FCONNECT were to remain at the $V_{cc}$ level while $V_{sup}$ falls to a value at least as low as $V_{cc}-V_t$. Under the latter condition, P14 would couple the common gate of P16 and N16 (and the source of N14) to $V_{sup}$. Thus, if $V_{sup}$ were lowered to as low as $V_{cc}-V_t$ (with FCONNECT=$V_{cc}$ applied to the gate of N14), transistor N14 would turn on and would not allow the common gate of P16 and N16 to go any lower. So, for a true $V_{th}$ test mode where a much lower voltage than $V_{cc}$ on the wordline is desired, this would pose a serious problem. However, this undesirable situation is avoided by the portion of the FIG. 6 circuit (described in the following paragraphs) which generates control signal FCONNECT in such a manner as to cause FCONNECT to have the level $V_{sup}$ at times when $V_{sup}$ is less than $V_{cc}$.

With reference to FIG. 6, signal VTL is high when $V_{sup}$ is less than $V_{cc}$. When VTL is high, components I3, N2, P2, P4, N4, P6, P8, and P10 of the FIG. 6 circuit switch FCONNECT from $V_{cc}$ to $V_{sup}$. Thus, with FCONNECT= $V_{sup}$ applied to the gate of N14 (when VTL is high) N14 is prevented from turning on (after passing signal SELECT to the gate of P16 and N16 and then turning off) even if $V_{sup}$ falls very low (e.g., below $V_{cc}-V_t$), since VGS of N14 is equal to 0 volts under this condition (since both the source of N14, which is connected to the gate of P16 and N16, and the gate of N14 are at $V_{sup}$).

As noted, decoder 12' of FIG. 6 includes circuitry for generating control signal FCONNECT. This circuitry asserts control signal FCONNECT to the gate of each MOS transistor switch within decoder 12' (e.g., to the gate of NMOS transistor N14 shown in FIG. 6 and also to the gates of other NMOS transistors which are not shown but which are associated with other wordlines). When the wordline connected to Node 1 of FIG. 6 has been deselected (in response to a high value of SELECT at the output of G2), the output voltage $V_{out}$ asserted to the wordline is substantially equal to ground potential since N16 is on, P16 is off, and P14 is on. When the wordline connected to Node 1 of FIG. 6 has been selected (in response to a low value of SELECT at the output of G2), the output voltage $V_{out}$ asserted to the wordline is substantially equal to $V_{sup}$ since N16 is off, P16 is on, and P14 is off.

In accordance with the invention, $V_{sup}$ may have any of a wide range of positive values including values substantially higher than $V_{cc}$ (e.g., $V_{sup}$ may be as high as 7.8 or 12 volts when $V_{cc}$, and thus the "high" value of SELECT, has a typical value of 5 volts), and values substantially lower than $V_{cc}$ (e.g., $V_{sup}$ may be as low as 1 volt when $V_{cc}$ has a typical value of 5 volts.

Still with reference to FIG. 6, control signal FCONNECT is generated by the circuitry comprising inverter I3, NMOS transistors N2 and N4, and PMOS transistors P2, P4, P6, P8, and P10, connected as shown. The source of each of P2, P4, and P6 (and also of each of above-discussed P14 and P16) is connected to Node 5 of FIG. 5 and thus receives voltage $V_{sup}$ (when at least one of VTL and VTH is high). As noted above, VTL is high during the true $V_{th}$ measurement test mode when $V_{sup}$ is below supply voltage $V_{cc}$, and VTL is low when $V_{sup}$ is above supply voltage $V_{cc}$.

In response to a low value of VTL, the FIG. 6 circuit asserts signal FCONNECT with a value equal to $V_{cc}$. This occurs because when VTL is low, P10 is on, P8 is on (since N2 is on and P2 is off), and P6 is off (since N4 and P2 are off, and P4 is on).

In response to a high value of VTL, the FIG. 6 circuit asserts signal FCONNECT with a value equal to $V_{sup}$. This occurs because when VTL is high, P10 is off, P8 is off (since N2 and P4 are off, and P2 is on), and P6 is on (since N4 is on and P4 is off).

In some test modes in which VTL is high, $V_{sup}$ is substantially lower than $V_{cc}$. An example of such a test mode is one in which $V_{cc}$ is 5 volts and $V_{sup}$ is 3 volts or less. In such test modes, N14 can allow a high voltage level to pass to the gate of P16 and N16, to cause assertion of voltage $V_{sup}$ on the wordline connected to Node 1 of FIG. 1, without preventing $V_{sup}$ from going lower than $V_{cc}-V_t$), while the wordline drivers of all the other wordlines are off. In this case, all the deselected wordlines are connected to a low voltage substantially equal to ground while the selected wordline is at voltage $V_{sup}$, and $V_{sup}$ is substantially less than $V_{cc}$ (e.g., $V_{sup}$=3 volts and $V_{cc}$=5 volts). Thus, in such test modes (in which control unit 29 asserts a high value of control signal VTL), the low voltage $V_{sup}$ is asserted simultaneously to the control gates of all the memory array cells on the selected wordline.

The inventive circuitry described above allows a chip to operate in test modes (denoted herein as true $V_{th}$ measurement test modes, and indicated by a high value of control signal VTL or VTH) in which a voltage substantially equal to external voltage $V_{sup}$ is applied to selected ones of the wordlines of a memory array of the chip, and the cells are read using the same circuitry that would be used to execute a normal read operation (e.g., sense amplifier 19 and output buffer 20 of FIG. 4). The essential difference between a normal read operation and a read operation in one of these test modes is that a test voltage substantially equal to a specially selected external voltage $V_{sup}$ is applied to the control gates of selected ones of the rows of cells (e.g., to selected ones of the wordlines of the array of cells) while the cells are read. The external voltage $V_{sup}$ (provided by an external device to an external pad of the chip) is specially selected to have an appropriate value (or sequence of values) for implementing a desired test of the cells' characteristics. In contrast, a fixed internal supply voltage (e.g., $V_{cc}$=5 volts) is applied to the control gates in a normal read operation (or in a conventional test mode of the type which can be performed using conventional circuitry).

The inventive circuitry allows each test voltage (a voltage substantially equal to an external voltage $V_{sup}$ provided to an external pad) applied to a cell's control gate during any of the true $V_{th}$ measurement test modes to have any selected value within a broad range, such as a range from 12 volts down to the threshold voltage of PMOS transistors in the chip's X decoder which latter voltage is typically less than 1 volt). A true $V_{th}$ measurement test performed in accordance with the invention includes the steps of performing a fast read cycle while applying such a test voltage to the control gates of cells, and logging which of the cells fail to read as expected (thereby generating useful test data concerning the threshold voltage distribution of the cells). In one example in which such a test is performed after the cells have undergone an erase operation (so that the threshold voltages of the cells are in a range from 1 volt to 3 volts) a sequence of test voltages in the range from 1 volt to 3 volts is selected, a fast read cycle performed while applying each of the test voltages in the sequence to the cells' control gates, and those of the cells that fail to read as an erased cell (i.e., those for which the sense amplifier detects current flow less than the sense amplifier's reference current value) are identified for each of the test voltages. Such a true $V_{th}$ measurement test can be performed several times, each time with a different sense amplifier reference current value.

A $V_{th}$ measurement test mode can be implemented in accordance with the invention in any of a variety of ways, including (but not limited to) the following:

the highest $V_{th}$ of an array of erased cells can be rapidly determined by reading the array no more than a few times, each time with a different test voltage applied directly to the wordlines of the array;

a statistical analysis with respect to $V_{th}$ distribution can be accomplished by reading the array a few times, each time with a different test voltage applied directly to the wordlines of the array, and counting the number of cells that fail to read successfully during each read operation;

the array can be read a few times, each time with a different test voltage applied directly to the wordlines of the array, with the cells that fail to read successfully during each read operation being identified, and this operation then can be repeated with the sense amplifier operating with a different reference current; and any of a variety of tests can be implemented with the sense amplifier reference current being varied (in addition to the test voltage applied to the wordlines being varied), and the resulting test data processed to determine how much margin is built into the sensing window.

Preferred embodiments of the invention have been described with reference to FIGS. 4, 5, and 6. Although these embodiments have been described in some detail, it is contemplated that changes from these embodiments can be made without departing from the spirit and scope of the invention as defined by the appended claims.

What is claimed is:

1. An integrated memory circuit operable in a selected one of a test mode and a normal operating mode, the memory circuit including:

an external pad which receives an external voltage;

a memory array including rows and columns of memory cells having control gates, each of said cells having one of said control gates;

a switch having an input terminal connected to the external pad and an output terminal connected to a first node, said switch having a state in which it asserts a test voltage at least substantially equal to the external voltage to the first node during the test mode in response to at least one of a set of test mode signals;

a selection circuit connected between the first node and the control gates, said selection circuit having a state in which it connects the first node to the control gates of at least a selected one of the rows of memory cells;

a sense amplifier connected to a selected one of the columns of the memory cells; and a controller connected to the sense amplifier and the selection circuit and configured to assert control signals to at least one of the selection circuit and the sense amplifier, to cause the sense amplifier to read a selected one of the cells of said selected one of the rows at a time during the test mode when the test voltage is provided through the first node to the control gate of said selected one of the cells, wherein the controller is also configured to assert said at least one of the set of test mode signals to the switch during the test mode.

2. The memory circuit of claim 1, wherein each of the cells is a nonvolatile memory cell.

3. The memory circuit of claim 2, wherein the rows and columns of said cells are connected along wordlines and bitlines, wherein the control gates of each of the rows of the cells are connected along a different one of the wordlines, and wherein each of the columns of the cells is connected along a different one of the bitlines.

4. An integrated memory circuit operable in a selected one of a test mode and a normal operating mode, the memory circuit including:

an external pad which receives an external voltage;

a memory array including rows of memory cells having control gates, each of said cells having one of said control gates, a switch having an input terminal connected to the external pad and an output terminal connected to a first node, said switch having a state in which it asserts a test voltage at least substantially equal to the external voltage to the first node during the test mode in response to at least one of a set of test mode signals; and a selection circuit connected between the first node and the control gates, said selection circuit having a state in which it connects the first node to the control gates of at least a selected one of the rows of memory cells during the test mode, wherein the switch includes:

at least one transistor to which an internal supply voltage is provided, wherein the output terminal is at the test voltage when the switch receives said at least one of the set of test mode signals; and an isolation circuit connected to the output terminal and configured to decouple the output terminal from said at least one transistor in response to said at least one of the set of test mode signals.

5. The memory circuit of claim 4, wherein said at least one transistor is a PMOS transistor formed in a well of said memory circuit, and wherein the isolation circuit includes a first circuit connected to the well and configured to prevent the well from turning on in response to the internal supply voltage exceeding the external voltage, thereby preventing said PMOS transistor from clamping the output terminal at a voltage substantially equal to the internal supply voltage when the internal supply voltage exceeds the external voltage at times when the switch receives said at least one of the set of test mode signals.

6. The memory circuit of claim 1, also including:
   at least one transistor to which an internal supply voltage is provided; and
   wherein the controller is connected to the switch and configured to generate the set of test mode signals, wherein the set of test mode signals includes a first test mode signal and a second test mode signal, wherein the controller asserts the first test mode signal to the switch during the test mode when the external voltage exceeds the internal supply voltage, and wherein the controller asserts the second test mode signal to the switch during the test mode when the internal supply voltage exceeds the external voltage.

7. The memory circuit of claim 6, wherein the selection circuit includes:
   a second switch connected to the control gates and having a state in which it connects the control gates of a row of the cells to the first node in response to a first value of a row selection signal, and having another state in which it connects the control gates of said row of cells to ground potential in response to a second value of the row selection signal.

8. The memory circuit of claim 7, also including an X decoder circuit, and wherein the selection circuit is a component of the X decoder circuit.

9. The memory circuit of claim 8, wherein the second test mode signal has a first value during the test mode when the external voltage exceeds the internal supply voltage and a second value during the test mode when the internal supply voltage exceeds the external voltage, wherein the memory array includes rows and columns of said cells connected along wordlines and bitlines, the control gates of each of the rows of the cells are connected along a different one of the wordlines, and each of the columns of the cells is connected along a different one of the bitlines, and wherein the second switch includes:
   a first circuit connected to receive the second test mode signal and configured to generate a control signal in response to the second test mode signal; and
   an MOS transistor for each of the wordlines, each said MOS transistor having a gate which receives the control signal and a channel terminal which receives a wordline selection signal, wherein said row selection signal is the wordline selection signal for one said MOS transistor, wherein the control signal has a first level in response to the first value of the second test mode signal, and wherein the control signal has a second level in response to the second value of the second test mode signal, whereby the control signal prevents each said MOS transistor from turning on when the second switch connects the one of the wordlines for said MOS transistor to the first node during the test mode when the internal supply voltage exceeds the external voltage.

10. The memory circuit of claim 1, wherein each of the cells is a flash memory cell.

11. The memory circuit of claim 4, wherein the test voltage has any value in a range including first values substantially greater than the internal supply voltage and second values substantially lower than the internal supply voltage.

12. The memory circuit of claim 11, wherein the internal supply voltage is substantially equal to five volts, and said range extends from 1 volt to at least 7.8 volts.

13. An integrated memory circuit operable in a selected one of a normal operating mode and a set of test modes, the memory circuit including:
   an external pad which receives an external voltage;
   a memory array including rows and columns of memory cells having control gates, each of said cells having one of said control gates;
   a sense amplifier connected to a selected one of the columns of the memory cells; and
   a test mode circuit connected to the external pad and to the memory array, and configured to control implementation of a true $V_{th}$ measurement test mode in which a test voltage substantially equal to said external voltage is applied to the control gates of at least a selected one of the rows of memory cells and the sense amplifier reads a selected one of the memory cells of said selected one of the rows at a time when said test voltage is provided to the control gate of said selected one of the memory cells.

14. The memory circuit of claim 13, wherein the external voltage has a sequence of different voltage values, and the test mode circuit is programmed to control implementation of a second true $V_{th}$ measurement test mode in which a sequence of test voltages each substantially equal to one of the voltage values of the external voltage is applied to the control gates of at least a selected one of the rows of memory cells.

15. The memory circuit of claim 13, wherein each of the cells is a nonvolatile memory cell.

16. The memory circuit of cl aim 13, wherein each of the cells is a flash memory cell.

17. The memory circuit of claim 13, wherein the memory array includes rows and columns of said cells connected along wordlines and bitlines, wherein the control gates of each of the rows of the cells are connected along a different one of the wordlines, wherein each of the columns of the cells is connected along a different one of the bitlines, and wherein the sense amplifier is connected to a selected one of the bitlines.

18. A method for operating an integrated memory circuit in a true $V_{th}$ measurement test mode, wherein the memory circuit includes an external pad which receives an external voltage and a memory array including rows of memory cells having control gates, each of said cells having one of said control gates, wherein the method includes the steps of:
   (a) providing a test voltage at least substantially equal to the external voltage to a first node of the memory circuit in response to at least one of a set of test mode signals; and
   (b) connecting the first node to the control gates of at least a selected one of the rows of memory cells during performance of step (a).

19. The method of claim 18, wherein each of the cells is a nonvolatile memory cell, the memory array includes rows and columns of said cells connected along wordlines and bitlines, the control gates of each of the rows of said cells are connected along a different one of the wordlines, and each of the columns of said cells is connected along a different ones of the bitlines, and also including the steps of:

controlling a sense amplifier connected to a selected one of the bitlines to read a selected one of the cells connected along said selected one of the bitlines at a time when said test voltage is provided through the first node to the control gate of said selected one of the cells.

20. The method of claim 18, wherein the external voltage has a sequence of different voltage values, and wherein step (a) includes the step of:

providing a sequence of test voltages to the first node in response to the least one of the set of test mode signals, where each of the test voltages is substantially equal to one of the voltage values of the external voltage.

21. The method of claim 20, wherein each of the cells is a nonvolatile memory cell, the memory array includes rows and columns of said cells connected along wordlines and bitlines, the control gates of each of the rows of the cells are connected along a different one of the wordlines, and each of the columns of the cells is connected along a different one of the bitlines, and also including the steps of:

controlling a sense amplifier connected to a selected one of the bitlines to read a selected one of the cells connected along said selected one of the bitlines at a time when said sequence of test voltages is provided through the first node to the control gate of said selected one of the cells.

22. The method of claim 18, wherein step (a) includes the step of:

(c) providing the test voltage to an output terminal of a switch in response to said at least one of the set of test mode signals, wherein the output terminal is connected to the first node; and (d) decoupling the output terminal from an internal supply voltage of the memory circuit in response to said at least one of the set of test mode signals.

23. The method of claim 22, wherein the memory circuit includes a PMOS transistor formed in a well, and wherein step (d) includes the step of preventing the well from turning on in response to the internal supply voltage exceeding the external voltage, thereby preventing said PMOS transistor from clamping the output terminal at a voltage substantially equal to the internal supply voltage when the internal supply voltage exceeds the external voltage at times when the switch receives said at least one of the set of test mode signals.

24. The method of claim 18, also including the steps of:

generating a first one of the test mode signals when the external voltage exceeds the internal supply voltage, and generating a second one of the test mode signals when the internal supply voltage exceeds the external voltage.

25. The method of claim 18, wherein the integrated memory circuit includes at least one transistor which receives an internal supply voltage, and wherein the test voltage has any value in a range including first values substantially greater than the internal supply voltage and second values substantially lower than the internal supply voltage.

26. The method of claim 25, wherein the internal supply voltage is substantially equal to five volts, and said range extends from 1 volt to at least 7.8 volts.

* * * * *